(12) United States Patent
Sawabe et al.

(10) Patent No.: US 9,018,620 B2
(45) Date of Patent: Apr. 28, 2015

(54) ORGANIC ELECTROLUMINESCENT LIGHT EMITTING DEVICE AND METHOD FOR MANUFACTURING THE SAME

(75) Inventors: Tomoaki Sawabe, Tokyo (JP); Tomio Ono, Kanagawa-ken (JP); Keiji Sugi, Kanagawa-ken (JP); Toshiya Yonehara, Kanagawa-ken (JP); Shintaro Enomoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/413,027

(22) Filed: Mar. 6, 2012

(65) Prior Publication Data
US 2012/0228591 A1 Sep. 13, 2012

(30) Foreign Application Priority Data

Mar. 8, 2011 (JP) ................. 2011-049899

(51) Int. Cl.
*H01L 51/52* (2006.01)
*H01L 51/56* (2006.01)

(52) U.S. Cl.
CPC ........ *H01L 51/5203* (2013.01); *H01L 51/5268* (2013.01); *H01L 51/5275* (2013.01); *H01L 51/56* (2013.01)

(58) Field of Classification Search
USPC .......................................................... 257/40
See application file for complete search history.

(56) References Cited

U.S. PATENT DOCUMENTS

| 7,508,130 | B2 * | 3/2009 | Cok | 313/512 |
|---|---|---|---|---|
| 8,373,170 | B2 * | 2/2013 | Murakami | 257/72 |
| 2008/0003424 | A1 | 1/2008 | Kawamura | |
| 2009/0114944 | A1 | 5/2009 | Ono et al. | |
| 2011/0180835 | A1 | 7/2011 | Ono et al. | |
| 2011/0215362 | A1 | 9/2011 | Ono et al. | |
| 2011/0215711 | A1 | 9/2011 | Yonehara et al. | |

FOREIGN PATENT DOCUMENTS

| CN | 101630720 A | 1/2010 |
|---|---|---|
| JP | 2002-164902 A | 6/2002 |
| JP | 2002-237389 | 8/2002 |
| JP | 2003-317937 | 11/2003 |

(Continued)

OTHER PUBLICATIONS

U.S. Appl. No. 14/045,133, filed Oct. 3, 2013, Ono, et al.

(Continued)

*Primary Examiner* — Asok K Sarkar
*Assistant Examiner* — Damian A Hillman
(74) *Attorney, Agent, or Firm* — Oblon, McClelland, Maier & Neustadt, L.L.P.

(57) ABSTRACT

According to one embodiment, an organic electroluminescent light emitting device includes a transparent substrate, an intermediate layer, a first electrode, an organic light emitting layer, and a second electrode. The intermediate layer includes a plurality of fine particles and a flattened layer. The fine particles are adhered to a major surface of the transparent substrate. The flattened layer covers the fine particles and has a refractive index different from a refractive index of the fine particles. The flattened layer is transparent. The first electrode is provided on the intermediate layer. The first electrode is transparent. The organic light emitting layer is provided on the first electrode. The second electrode is provided on the organic light emitting layer.

13 Claims, 9 Drawing Sheets

(56) References Cited

FOREIGN PATENT DOCUMENTS

| | | | | |
|---|---|---|---|---|
| JP | 2004-164902 | A | | 6/2004 |
| JP | 2002164902 | A | * | 6/2004 |
| JP | 2004164902 | A | * | 6/2004 |
| JP | 2005-353367 | A | | 12/2005 |
| JP | 2005353367 | A | * | 12/2005 |
| JP | 2005353367 | A | * | 12/2005 |
| JP | 2006-130685 | A | | 5/2006 |
| JP | 2006130685 | A | * | 5/2006 |
| JP | 2006130685 | A | * | 5/2006 |
| JP | 4177788 | B2 | | 11/2008 |
| JP | 2009-110930 | A | | 5/2009 |
| JP | 2009-146924 | | | 7/2009 |
| JP | 2009-216862 | | | 9/2009 |
| JP | 2010-45011 | A | | 2/2010 |
| JP | 2010045011 | A | * | 2/2010 |
| JP | 2010045011 | A | * | 2/2010 |
| JP | 2010-512434 | A | | 4/2010 |
| JP | 2010-157424 | | | 7/2010 |
| JP | 2010-533932 | | | 10/2010 |
| TW | 200802976 | | | 1/2008 |
| TW | 200913767 | | | 3/2009 |

OTHER PUBLICATIONS

Office Action issued Mar. 21, 2014 in Korean Patent Application No. 10-2012-23336 (with English translaiton).
U.S. Appl. No. 13/229,977.
U.S. Appl. No. 13/224,971.
Yuan-Sheng Tyan, et al., "61.2: Fluorescent White OLED Devices with Improved Light Extraction", SID 08 Digest, 2008, pp. 933-936.
Nobuhiro Nakamura, et al., "40.4: Glass Substrates for OLED Lighting with High Out-coupling Efficiency" SID 09 Digest, 2009, pp. 603-606.
Korean Office Action issued May 14, 2014, in Korea Patent Application No. 10-2014-22526 (with English Translation).
Office Action issued on May 28, 2014 in the counterpart Chinese Patent Application No. 201210060113.1 (with English Translation).
Taiwanese Office Action issued Nov. 18, 2014, in Taiwan Patent Application No. 101107905 (with English translation).
Office Action issued Nov. 26, 2014 in Korean Patent Application No. 10-2014-22526 (with English Translation).
Yiru Sun, et al., "Enhanced light out-coupling of organic light-emitting devices using embedded low-index grids", Nature Photonics, vol. 2, Aug. 2008, pp. 483-487.
The Extended European Search Report issued Jun. 8, 2012, in Application No. / Patent No. 12158561.6-2111.
Office Action issued Jul. 25, 2013 in Korean Patent Application No. 10-2012-0023336 with English language translation.
Korean Office Action issued Nov. 25, 2013, in Korea Patent Application No. 10-2012-23336 (with English translation).
Japanese Office Action issued Nov. 26, 2013, in Japan Patent Application No. 2011-049899 (with English translation).
U.S. Appl. No. 13/711,769, filed Dec. 12, 2012, Sawabe, et al.
U.S. Appl. No. 13/718,493, filed Dec. 18, 2012, Sawabe, et al.
Office Action issued Feb. 12, 2013 in Japanese Patent Application No. 2011-049899 with English language translation.
Office Action issued Jan. 20, 2015 in Korean Patent Application No. 10-2014-0022526 (with English translation).
Office Action issued Jan. 6, 2015 in Chinese Patent Application No. 201210060113.1 (with English translation).

* cited by examiner

ORGANIC ELECTROLUMINESCENT LIGHT EMITTING DEVICE AND METHOD FOR MANUFACTURING THE SAME

CROSS-REFERENCE TO RELATED APPLICATIONS

This application is based upon and claims the benefit of priority from the prior Japanese Patent Application No. 2011-049899, filed on Mar. 8, 2011; the entire contents of which are incorporated herein by reference.

FIELD

Embodiments described herein relate generally to an organic electroluminescent light emitting device and a method for manufacturing the same.

BACKGROUND

In recent years attention has focused on organic electroluminescent light emitting devices for applications such as plane light sources and the like. In an organic electroluminescent light emitting device, an organic thin film is provided between a cathode and an anode. By applying a voltage to the organic thin film, electrons are injected from the cathode, electron holes are injected from the anode, and excitons are generated by causing recombination. The light emitted when the excitons radiatively deactivate is used.

In organic electroluminescent light emitting devices, it is desirable to improve the light extraction efficiency.

DETAILED DESCRIPTION

Figure 1A:
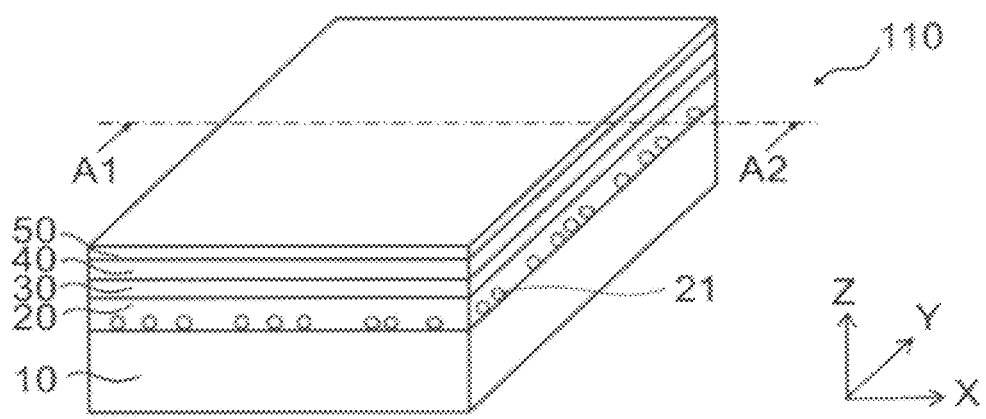
FIG. 1A to FIG. 1C are schematic views showing the configuration of an organic electroluminescent light emitting device according to an embodiment.

According to one embodiment, an organic electroluminescent light emitting device includes a transparent substrate, an intermediate layer, a first electrode, an organic light emitting layer, and a second electrode. The transparent substrate has a major surface. The intermediate layer includes a plurality of fine particles and a flattened layer. The fine particles are adhered to the major surface. The flattened layer covers the fine particles and has a refractive index different from a refractive index of the fine particles. The flattened layer is transparent. The first electrode is provided on the intermediate layer. The first electrode is transparent. The organic light emitting layer is provided on the first electrode. The second electrode is provided on the organic light emitting layer.

According to another embodiment, a method is disclosed for manufacturing an organic electroluminescent light emitting device. The method can include adhering a plurality of fine particles to a major surface of a transparent substrate. The fine particles are charged with a polarity different from a polarity of charge of the transparent substrate. The method can include forming a flattened layer so as to cover the fine particles and flatten a surface of the flattened layer. The flattened layer has a refractive index higher than a refractive index of the fine particles. The flattened layer is transparent. The method can include forming a first electrode on the flattened layer, the first electrode being transparent. The method can include forming an organic light emitting layer on the first electrode. In addition, the method can include forming a second electrode on the organic light emitting layer.

According to another embodiment, a method is disclosed for manufacturing an organic electroluminescent light emitting device. The device includes a transparent substrate having a major surface, an intermediate layer including a plurality of fine particles and a flattened layer, the fine particles being adhered to the major surface, the flattened layer covering the fine particles and having a refractive index different from a refractive index of the fine particles, the flattened layer being transparent, a first electrode provided on the intermediate layer the first electrode being transparent, an organic light emitting layer provided on the first electrode, and a second electrode provided on the organic light emitting layer. The method can include applying a resin liquid onto the major surface of the transparent substrate, the resin liquid having the fine particles dispersed in a resin forming the flattened layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
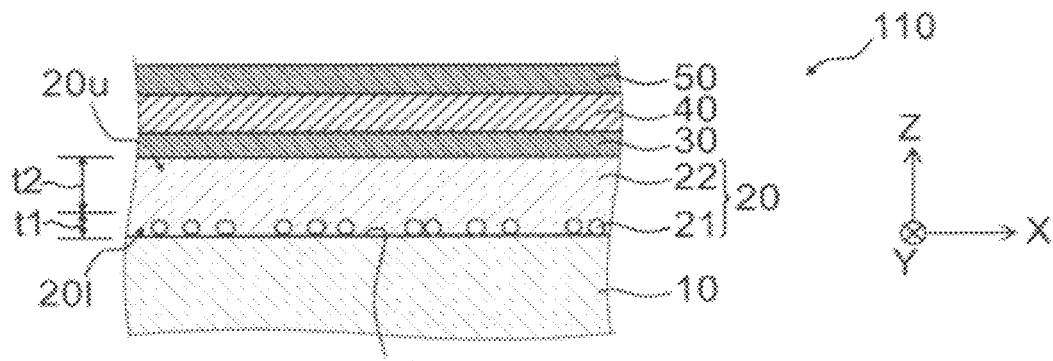
Figure 1C:
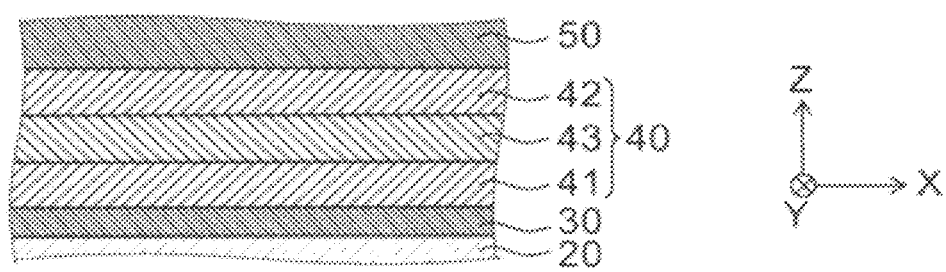

FIG. 1A to FIG. 1C are schematic views illustrating the configuration of an organic electroluminescent light emitting device according to an embodiment.

FIG. 1A is a perspective view. FIG. 1B is a cross-sectional view on the line A1-A2 in FIG. 1A. FIG. 1C is a schematic cross-sectional view illustrating the configuration of a part of the organic electroluminescent light emitting device, corresponding to the cross-sectional view on the line A1-A2 in FIG. 1A.

As shown in FIG. 1A and FIG. 1B, an organic electroluminescent light emitting device 110 according to the embodiment includes a transparent substrate 10, an intermediate layer 20, a first electrode 30, an organic light emitting layer 40, and a second electrode 50.

The intermediate layer 20 is provided on the transparent substrate 10. The intermediate layer 20 includes a plurality of fine particles 21 and a flattened layer 22. The plurality of fine particles 21 is adhered to a major surface 10a of the transparent substrate 10. The flattened layer 22 covers the plurality of fine particles 21. The flattened layer 22 is transparent, and has a refractive index that is higher than the refractive index of the plurality of fine particles 21. For example, the flattened layer 22 is made of resin. For example, the top surface (the surface on the opposite side of the transparent substrate 10) of the flattened layer 22 is flat. For example, there are substantially no irregularities on the top surface of the flattened layer 22 due to the plurality of fine particles 21.

The first electrode 30 is provided on the intermediate layer 20. The first electrode 30 is transparent. The organic light emitting layer 40 is provided on the first electrode 30. The second electrode 50 is provided on the organic light emitting layer 40. For example, the second electrode 50 is reflective.

For example, the organic light emitting layer 40 emits light that includes a component with the wavelength of visible light. The light emitted from the organic light emitting layer 40 is substantially white light. In other words, the light emitted from the organic electroluminescent light emitting device 110 is white light. Here, "white light" is substantially white color, and includes reddish-, yellowish-, greenish-, bluish-, and purple-ish white light, and so on.

The transparent substrate 10 and the first electrode 30 are transmissive to the light emitted from the organic light emitting layer 40. The second electrode 50 has reflectivity with respect to the light emitted from the organic light emitting layer 40. The flattened layer 22 has transmittivity with respect to the light emitted from the organic light emitting layer 40.

Here, the direction from the transparent substrate 10 toward the second electrode 50 is taken to be the Z-axis direction (first direction). The Z-axis is the first axis. One axis normal to the Z-axis is taken to be the X-axis (second axis). The axis normal to the Z-axis and the X-axis is taken to be the Y-axis (third axis).

As shown in FIG. 1C, the organic light emitting layer 40 includes a light emitting portion 43. When necessary, the organic light emitting layer 40 can include a first layer 41 and/or a second layer 42. The light emitting portion 43 emits light that includes wavelengths of visible light. The first layer 41 is provided between the light emitting portion 43 and the first electrode 30. The second layer 42 is provided between the light emitting portion 43 and the second electrode 50.

A material such as, for example, $Alq_3$, F8BT, PPV, and so on, can be used in the light emitting portion 43. A mixed material that includes a host material and a dopant that is added to the host material can be used in the light emitting portion 43. For example, CBP, BCP, TPD, PVK, PPT, and so on, can be used as the host material. For example, Flrpic, $Ir(ppy)_3$, Flr6, and so on, can be used as the dopant material.

The first layer 41 functions as, for example, an electron hole injection layer. The first layer 41 functions as, for example, an electron hole transport layer. The first layer 41 may have, for example, a stacked structure that includes a layer that functions as an electron hole injection layer, and a layer that functions as an electron hole transport layer. The first layer 41 may include another layer apart from the layer that functions as an electron hole injection layer and the layer that functions as an electron hole transport layer.

The second layer 42 can include, for example, a layer that functions as an electron injection layer. The second layer 42 can include, for example, a layer that functions as an electron transport layer. The second layer 42 may have, for example, a stacked structure that includes a layer that functions as an electron injection layer, and a layer that functions as an electron transport layer. The second layer 42 may include another layer apart from the layer that functions as an electron injection layer and the layer that functions as an electron transport layer.

The transparent substrate 10 is, for example, a glass substrate.

The first electrode 30 includes an oxide that includes at least one element selected from the group that includes In, Sn, Zn, and Ti. For example, the first electrode 30 is an Indium Tin Oxide (ITO) film. The first electrode 30 functions as an anode, for example.

The second electrode 50 includes, for example, at least one of aluminum and silver. For example, an aluminum film is used in the second electrode 50. In addition, an alloy of silver and magnesium may be used as the second electrode 50. In this case, calcium may be added to this alloy.

In the intermediate layer 20, the refractive index of the plurality of fine particles 21 differs from the refractive index of the surrounding flattened layer 22. For example, the refractive index of the plurality of fine particles 21 is lower than the refractive index of the surrounding flattened layer 22. Or, the refractive index of the plurality of fine particles 21 is higher than the refractive index of the surrounding flattened layer 22. At the interface between the fine particles 21 and the flattened layer 22, the direction of the light emitted from the organic light emitting layer 40 is changed. The change in direction of the light is based on the scattering phenomenon. Also, the change in direction of the light is based on the refracting phenomenon.

In this way, of the light emitted from the organic light emitting layer 40, the proportion of the light that is totally reflected at the interface between the transparent substrate 10 and the intermediate layer 20 is reduced, for example. Thereby, light extraction efficiency improves.

The difference between the refractive index of the plurality of fine particles 21 and the refractive index of the flattened layer 22 is, for example, not less than 0.1. The effect of at least one of the scattering phenomenon and the refracting phenomenon is effectively produced, so the light extraction efficiency is effectively increased by setting the difference in refractive indexes at not less than 0.1.

For example, in a first reference example in which the intermediate layer 20 is not provided, the transparent substrate 10 and the first electrode 30 are in contact. Generally, the refractive index of the transparent substrate 10 is smaller than the refractive index of the first electrode 30, thereby the proportion of light that is totally reflected at the interface is high in the first reference example.

In contrast, in the embodiment, the intermediate layer 20, which includes the plurality of fine particles 21 and the flattened layer 22, is provided between the transparent substrate 10 and the first electrode 30, with different refraction indices. The plurality of fine particles 21 changes the direction of the light emitted from the organic light emitting layer 40 by scattering and/or refracting. This reduces the proportion of the light that is totally reflected at the interface of the transparent substrate 10, and increases the proportion of the light that is extracted outside.

In this way, according to the embodiment, it is possible to provide an organic electroluminescent light emitting device with high light extraction efficiency.

The internal quantum efficiency of the organic electroluminescent light emitting device is comparatively high. For example, it is possible to obtain an organic electroluminescent light emitting device with an internal quantum efficiency of close to 100%. However, conventionally the light extraction efficiency of an organic electroluminescent light emitting device was limited due to the relationship of the refraction indices of the organic material, the anode, substrates, and so on. In contrast, the organic electroluminescent light emitting device according to the embodiment can greatly increase the light extraction efficiency.

In the embodiment, the plurality of fine particles 21 is adhered to the major surface 10a of the transparent substrate 10. The fine particles 21 are covered with the flattened layer 22, and the surface of the flattened layer 22 is flat. Therefore, good properties are obtained for the first electrode 30, the organic light emitting layer 40, and the second electrode 50 that are provided on the flattened layer 22 (on the intermediate layer 20).

For example, as shown in FIG. 1B, the thickness t2 of the upper side portion 20u of the intermediate layer 20 that does not include the plurality of fine particles 21 is greater than the thickness t1 of the lower side portion 20l of the intermediate layer 20 that includes the plurality of fine particles 21. This sufficiently flattens the top surface of the intermediate layer 20. The thickness can be obtained from an electron microscope photographic image or the like, for example.

Figure 2A:
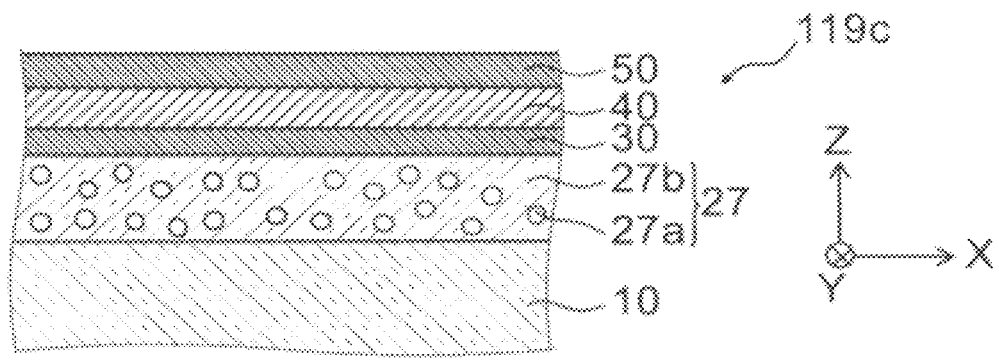
FIG. 2A to FIG. 2C are schematic cross-sectional views showing the configuration of organic electroluminescent light emitting devices according to reference examples.
Figure 2B:
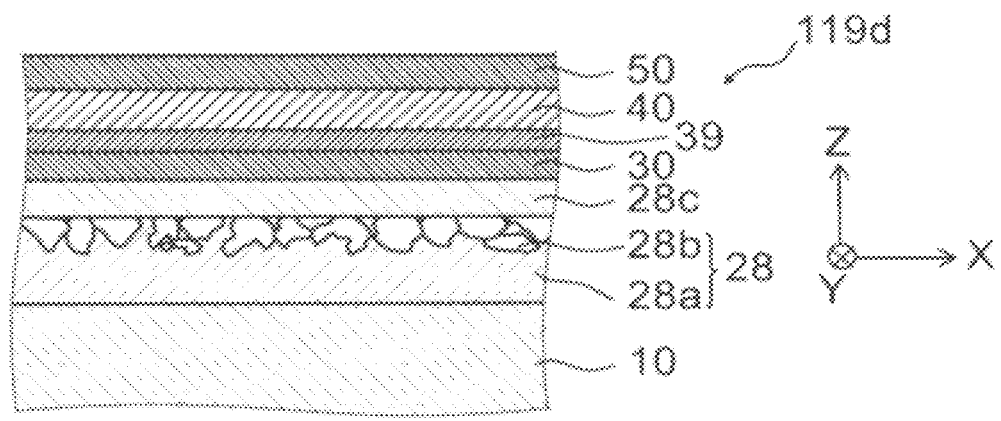
Figure 2C:
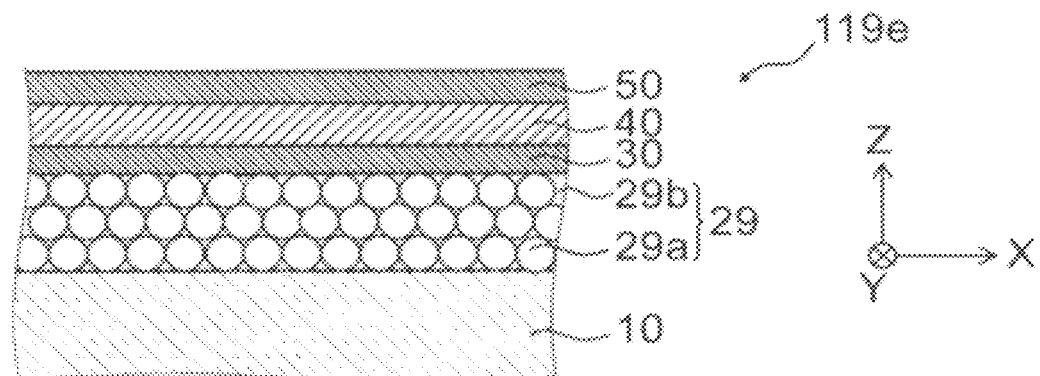

FIG. 2A to FIG. 2C are schematic cross-sectional views illustrating the configuration of organic electroluminescent light emitting devices according to reference examples.

As shown in FIG. 2A, in an organic electroluminescent light emitting device 119c according to a second reference example, an intermediate layer 27 is provided between the transparent substrate 10 and the first electrode 30. The intermediate layer 27 includes a high refractive index portion 27b and a plurality of low refractive index portions 27a dispersed throughout the high refractive index portion 27b. For example, the high refractive index portion 27b may be high refractive index glass, and the low refractive index portions 27a may be air voids. In this case, the plurality of low refractive index portions 27a is dispersed throughout the high refractive index portion 27b, thereby some of the plurality of the low refractive index portions 27a can easily be exposed on the top surface of the intermediate layer 27. Therefore irregularities are formed on the top surface of the intermediate layer 27, so it is not flat. Therefore, in the second reference example, the quality of, for example, the first electrode 30 (and the organic light emitting layer 40 and so on) that is in contact with the intermediate layer 27 is low, so good properties are difficult to obtain.

As shown in FIG. 2B, in an organic electroluminescent light emitting device 119d according to a third reference example, an intermediate layer 28 is provided between the transparent substrate 10 and the first electrode 30. Also, a high refractive index coupling layer 28c is provided between the intermediate layer 28 and the first electrode 30. The intermediate layer 28 includes a low refractive index layer 28a and a scattering body 28b provided on the top surface side of the low refractive index layer 28a. In this configuration, light is scattered by the scattering body 28b, with the aim of increasing the light extraction efficiency. However, it is necessary to provide the high refractive index coupling layer 28c in order to guide the light to the scattering body 28b. In addition, the scattering body 28b is disposed on the top surface side of the intermediate layer 28, thereby the flatness of the top surface of the intermediate layer 28 is not good. Therefore, the flatness of the surface of the first electrode 30, for example, is also not good. Therefore it is necessary to provide a short-circuit prevention layer 39 between the first electrode 30 and the organic light emitting layer 40. In this way, in the third reference example, the high refractive index coupling layer 28c and the short-circuit prevention layer 39 are necessary, thereby the configuration is complex. Therefore the productivity is low, and there is a limit to cost reduction.

As shown in FIG. 2C, in an organic electroluminescent light emitting device 119e according to a fourth reference example, an intermediate layer 29 is provided between the transparent substrate 10 and the first electrode 30. The intermediate layer 29 includes a plurality of fine particles 29a and a matrix 29b that is provided around the plurality of fine particles 29a. The intermediate layer 29 is a 3-dimensional diffraction layer. In other words, the plurality of fine particles 29a is disposed at a constant period. In this configuration, the diffraction effect is used. Therefore, it is difficult to obtain a good effect for light with a broad wavelength range, such as white light. In addition, the fine particles 29a are stacked along the Z-axis direction, thereby in this case also the flatness of the top surface of the intermediate layer 29 is not good.

In contrast, in the organic electroluminescent light emitting device 110 according to the embodiment, the plurality of fine particles 21 that change the direction of the light is adhered to the transparent substrate 10, and is covered by the flattened layer 22. Therefore, the top surface of the intermediate layer 20 (flattened layer 22) is sufficiently flat. In other words, for example, the short-circuit prevention layer 39 does not have to be used.

For example, the refractive index of the flattened layer 22 is close to the refractive index of the first electrode 30 and the refractive index of the organic light emitting layer 40. The difference between the refractive index of the flattened layer 22 and the refractive index of the first electrode 30, and the difference between the refractive index of the flattened layer 22 and the refractive index of the organic light emitting layer 40 are smaller than the difference between the refractive index of the plurality of fine particles 21 and the refractive index of the first electrode 30 and the difference between the refractive index of the plurality of fine particles 21 and the refractive index of the organic light emitting layer 40. Therefore it is easy to guide the light to the intermediate layer 20. For example, a high refractive index coupling layer and so on does not have to be provided, and the flattened layer 22 will perform its function. Also, the plurality of fine particles 21 changes the direction of the light by scattering and/or refracting, thereby it is possible to obtain an effect with light with a broad wavelength range. In other words, it is possible to increase the light extraction efficiency of white light using a simple configuration.

In the embodiment, the average diameter of the plurality of fine particles 21 is, for example, not less than 200 nanometers (nm) and not more than 1.5 micrometers (µm). Therefore, it is possible to efficiently change the direction of white light using scattering and/or refracting. It is possible to obtain the diameters from an electron microscope photographic image, for example.

When the diameter is less than 200 nm, the effect of scattering and refracting becomes small. Also, when the diameter is larger than 1.5 µm, it becomes difficult to obtain good flatness of the top surface of the intermediate layer 20, for example. If the thickness of the flattened layer 22 increases as the diameter increases, the flattened layer 22 will be easily cracked.

It is particularly desirable that the average diameter of the plurality of fine particles 21 is, for example, not less than 600 nm and not more than 900 nm. By using fine particles 21 with diameters in this range, a particularly high light extraction efficiency is obtained, and it is easy to suppress the occurrence of cracking or the like in the flattened layer 22.

For example, the average diameter of the fine particles 21 is set to be not less than the wavelength of visible light. Thereby, a great effect of scattering and refracting is obtained.

It is desirable that the thickness of the intermediate layer 20 (for example the sum of the thickness t1 and the thickness t2) is not more than 6 μm. This suppresses the occurrence of cracking and the like. It is particularly desirable that the thickness of the intermediate layer 20 is not more than 3 μm. The occurrence of cracking and the like is particularly suppressed.

Organic substance, for example, can be used in the plurality of fine particles 21. When the fine particles 21 are organic substance, the thermal properties (for example the thermal expansion coefficient) of the fine particles 21 are close to the values of those of the flattened layer 22. Therefore, the resistance to thermal load during manufacture and use of the organic electroluminescent light emitting device is increased.

For example, polystyrene (for example refractive index=1.6) can be used in the plurality of fine particles 21. This can easily make the particle diameters comparatively uniform.

Inorganic substance, for example, can be used in the plurality of fine particles 21. For example, the plurality of fine particles 21 can include silicon oxide. In other words, silica (for example refractive index=1.5) can be used as the fine particles 21. Also, titanium oxide (for example refractive index=2.7) can be used as the plurality of fine particles 21. If the fine particles 21 are inorganic substance, the difference between the refractive index of the flattened layer 22 and the refractive index of the fine particles 21 can be easily made large. This easily increases the light extraction efficiency.

As described later, it is possible to modify the surface of each of the plurality of fine particles 21 with, for example, quaternary ammonium cation. This allows the plurality of fine particles 21 to adhere to the major surface 10a of the transparent substrate 10 in a self-organized manner.

Each of the plurality of fine particles 21 has, for example, a spherical or ellipse of revolution shape. However, the embodiment is not limited to this. The fine particles 21 can have any desired shape. If each of the plurality of fine particles 21 has a spherical or ellipse of revolution shape, it is possible to increase the density (the filling ratio) of the plurality of fine particles 21, and the light extraction efficiency is easily increased, so this is further desirable.

For example a polysiloxane resin (for example, refractive index=1.78) can be used in the flattened layer 22. However, the embodiment is not limited to this, and any desired material can be used in the flattened layer 22. Components apart from resin, such as a filler or the like, may be included in the flattened layer 22.

As shown in FIG. 1B, in the organic electroluminescent light emitting device 110, substantially all the plurality of fine particles 21 is in contact with the top surface of the transparent substrate 10. In other words, a single layer of the plurality of fine particles 21 is provided. However, the embodiment is not limited to this, and a portion of the fine particles 21 may not be in contact with the top surface of the transparent substrate 10.

Figure 3A:
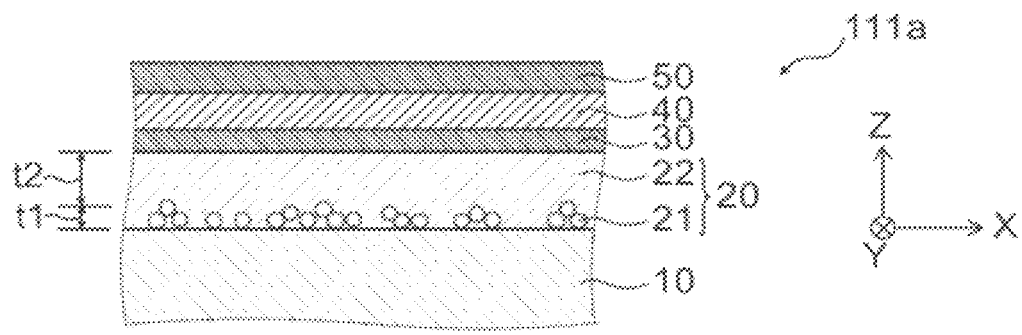
FIG. 3A and FIG. 3B are schematic cross-sectional views showing the configuration of other organic electroluminescent light emitting devices according to the embodiment.
Figure 3B:
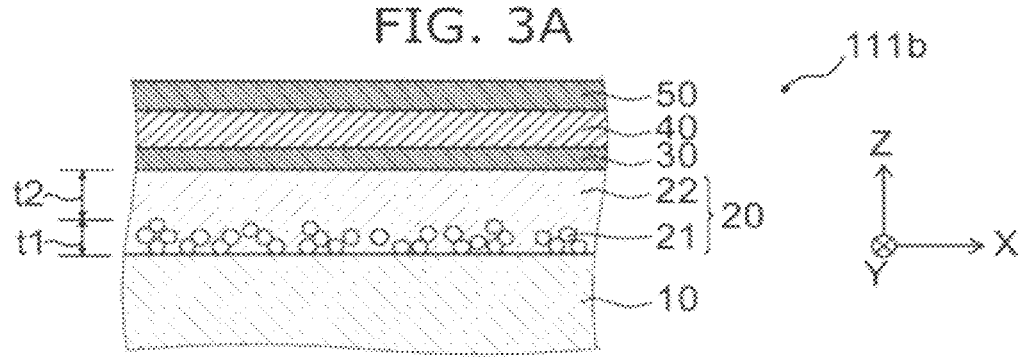

FIG. 3A and FIG. 3B are schematic cross-sectional views illustrating the configuration of other organic electroluminescent light emitting devices according to the embodiment.

As shown in FIG. 3A, in an organic electroluminescent light emitting device 111a according to the embodiment, a portion of the plurality of fine particles 21 is separated from the transparent substrate 10. In this example, in the portion of the fine particles 21, two fine particles 21 are stacked along the thickness direction. Within the intermediate layer 20, the thickness t1 of a portion that includes the plurality of fine particles 21 (for example, a lower side portion 20l) is about double the diameter of the fine particles 21.

As shown in FIG. 3B, in another organic electroluminescent light emitting device 111b according to the embodiment, in a portion of the fine particles 21, about three fine particles are stacked in the thickness direction. Within the intermediate layer 20, the thickness t1 of a portion that includes the plurality of fine particles 21 (for example, a lower side portion 20l) is about three times the diameter of the fine particles 21.

In the embodiment, the plurality of fine particles 21 is adhered to the transparent substrate 10. In this way, even when the flattened layer 22 is made thin so that cracking is difficult to occur, the flatness of the top surface of the flattened layer 22 is easily improved. However, all of the plurality of fine particles 21 does not necessarily have to contact the transparent substrate 10. For example, due to variation in the manufacturing conditions, most of the plurality of fine particles 21 may be adhered to the top surface of the transparent substrate 10, and a portion of the fine particles 21 may be separated from the transparent substrate 10 while contacting other fine particles 21.

For example, within the intermediate layer 20, the thickness of a portion that includes a plurality of fine particles (for example, the thickness t1 of a lower side portion 20l) is not more than four times the average diameter of the plurality of fine particles 21. Within the intermediate layer 20, more preferably the thickness of a portion that includes a plurality of fine particles is not more than three times the average diameter of the plurality of fine particles 21.

In the following a method for manufacturing the organic electroluminescent light emitting device according to the embodiment will be described.

Figure 4A:
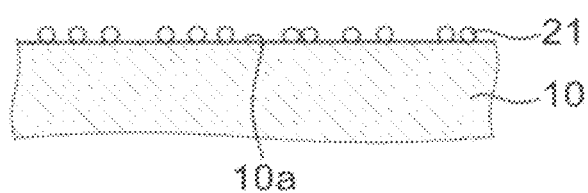
FIG. 4A and FIG. 4B are sequential schematic cross-sectional views showing a method for manufacturing the organic electroluminescent light emitting device according to the embodiment.
Figure 4B:
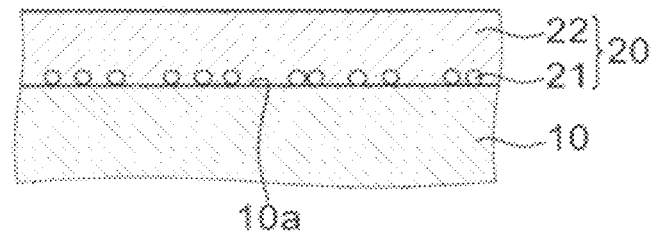

FIG. 4A and FIG. 4B are sequential schematic cross-sectional views illustrating a method for manufacturing the organic electroluminescent light emitting device according to the embodiment.

In this example, polystyrene particles with a diameter of about 200 nm are used as the plurality of fine particles 21. The surfaces of these polystyrene particles are modified with quaternary ammonium cation.

As shown in FIG. 4A, the plurality of fine particles 21 is adhered to the major surface 10a of the transparent substrate 10. For example, a solution that includes the polystyrene particles is applied onto the major surface 10a of the transparent substrate 10. The fine particles 21 are charged with a polarity that is different from the polarity of the charge of the transparent substrate 10. Therefore the fine particles 21 are adhered to the major surface 10a of the transparent substrate 10, and the plurality of fine particles 21 separate from each other. Thereby, the plurality of fine particles 21 in an approximately single layer is adhered to the major surface 10a of the transparent substrate 10.

A method of application such as a spin-coat method, a dip-coat method, an immersion method, a meniscus printing method, and so on can be used for a method of adhering the plurality of fine particles 21 to the major surface 10a of the transparent substrate 10.

As shown in FIG. 4B, the material that will form the flattened layer 22 is applied onto the major surface 10a of the transparent substrate 10 to which the plurality of fine particles 21 is adhered. For example, polysiloxane resin that includes a nanofiller is used as the flattened layer 22. Then, the solution is hardened to obtain the flattened layer 22. Thereby the intermediate layer 20 is obtained. Any desired method can be used for applying the solution that will form the flattened layer 22, such as the spin-coat method, the dip-coat method, the immersion method, the meniscus printing method, and so on.

Thereafter, the first electrode 30, the organic light emitting layer 40, and the second electrode 50 are formed successively on the intermediate layer 20. Thereby, the organic electroluminescent light emitting device is obtained.

Figure 5A:
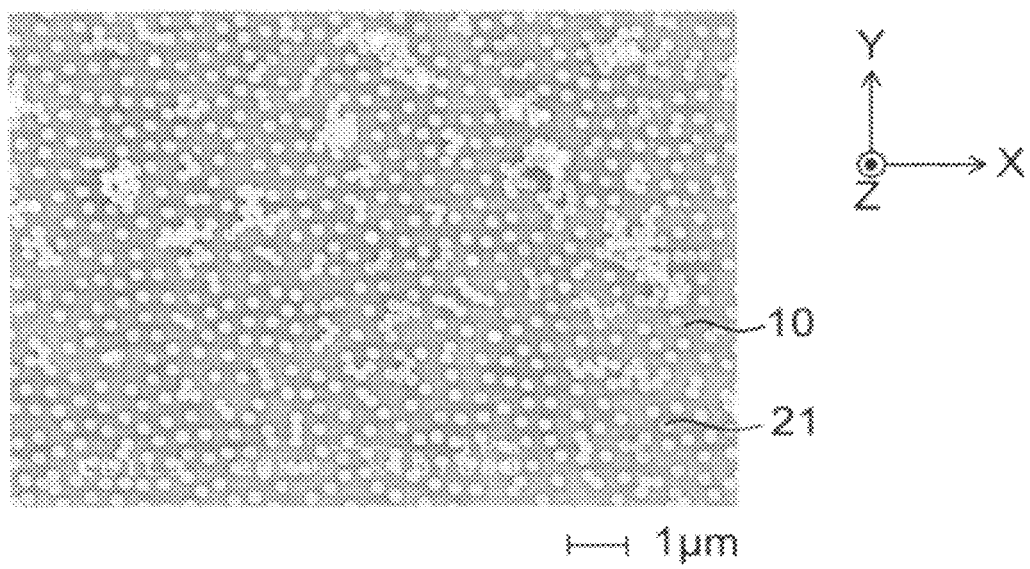
FIG. 5A and FIG. 5B are electron microscope photographic images showing the organic electroluminescent light emitting device according to the embodiment.
Figure 5B:
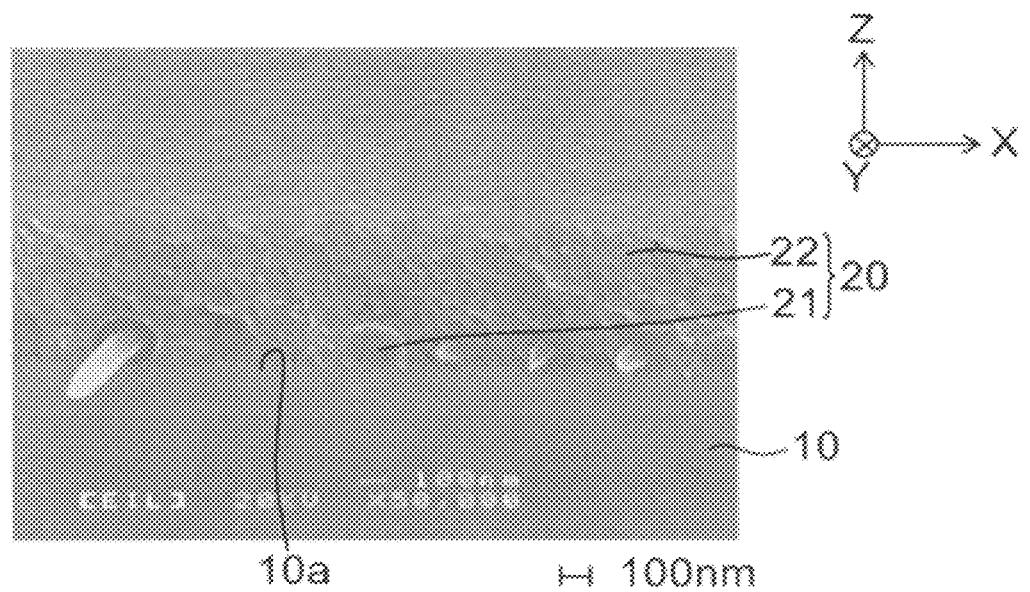

FIG. 5A and FIG. 5B are electron microscope photographic images showing the configuration of the organic electroluminescent light emitting device according to the embodiment.

FIG. 5A is an image of a test specimen after the plurality of fine particles 21 has been adhered to the major surface 10a of the transparent substrate 10. This image was taken along the Z-axis direction. FIG. 5B is an electron microscope photographic image of a cross-section after the material that will form the flattened layer 22 has been applied onto the transparent substrate 10 to which the plurality of fine particles 21 was adhered and the intermediate layer 20 was formed.

As shown in FIG. 5A, the plurality of fine particles 21 is adhered to the transparent substrate 10 in an approximately single layer. However, there are portions where a group of fine particles about three high has also formed due to variation in the manufacturing conditions or agglomeration of the fine particles 21 or the like.

The positions of the plurality of fine particles 21 are random. In this way, in the embodiment, when viewed from the Z-axis (the axis in the direction from the transparent substrate 10 toward the second electrode 50), the plurality of fine particles 21 is disposed randomly.

As shown in FIG. 5B, the plurality of fine particles 21 is adhered to the major surface 10a of the transparent substrate 10. In FIG. 5B, the shape of the fine particles 21 (polystyrene particles) that were elongated when the test specimen was sectioned to prepare the test specimen for taking the electron microscope image has been photographed.

As described above, in the embodiment, self-organization of the fine particles 21 is used as the method of adhering the plurality of fine particles 21 to the transparent substrate 10. This allows the plurality of fine particles to conveniently adhere to the transparent substrate 10 with a large area. Therefore, it is possible to manufacture with high productivity and low cost an organic electroluminescent light emitting device with high light extraction efficiency, in particular with a large area.

The following is a description of the characteristics of an organic electroluminescent light emitting device 110s according to the embodiment manufactured by this method and an organic electroluminescent light emitting device according to the first reference example.

Figure 6:
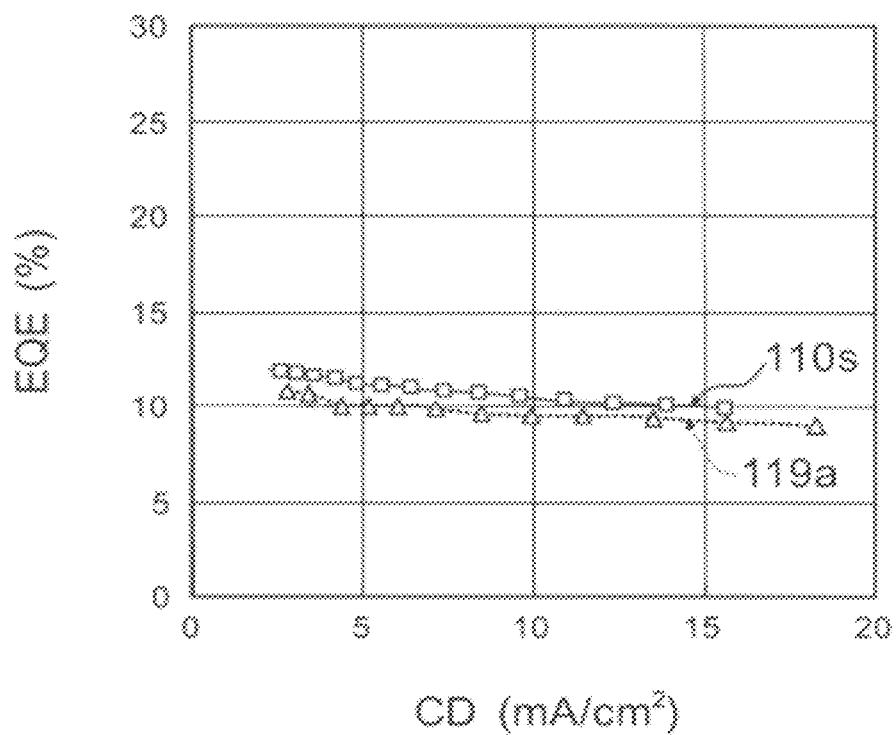
FIG. 6 is a graph showing the characteristics of the organic electroluminescent light emitting devices.

FIG. 6 is a graph showing the characteristics of the organic electroluminescent light emitting devices.

FIG. 6 shows the measurement results for the characteristics of the organic electroluminescent light emitting device 110s according to the embodiment and an organic electroluminescent light emitting device 119a according to the first reference example. In the organic electroluminescent light emitting device 110s, a glass substrate was used as the transparent substrate 10, polystyrene spheres with diameter of 200 nm were used as the fine particles 21, polysiloxane resin was used as the flattened layer 22, an ITO film was used as the first electrode 30, a layer that included Ir complex was used as the organic light emitting layer 40, and an aluminum film was used as the second electrode 50. The configuration of the organic electroluminescent light emitting device 119a was the same as the configuration of the organic electroluminescent light emitting device 110 except that the intermediate layer 20 (the fine particles 21 and the flattened layer 22) was not provided. The horizontal axis in FIG. 6 is the current density CD. The vertical axis in FIG. 6 is the external quantum efficiency EQE.

As shown in FIG. 6, in the organic electroluminescent light emitting device 110s according to the embodiment, a higher external quantum efficiency EQE than the organic electroluminescent light emitting device 119a according to the first reference example can be obtained.

In the following, the relationship between the filling rate of the fine particles 21 and the external quantum efficiency EQE in the organic electroluminescent light emitting device according to the embodiment is described.

FIG. 7A to FIG. 7F are schematic plan views illustrating disposals of fine particles in the organic electroluminescent light emitting device according to the embodiment.

These drawings illustrate disposals of the plurality of fine particles 21 on the major surface 10a of the transparent substrate 10. These drawings are plan views when viewed along the Z-axis.

Figure 7A:
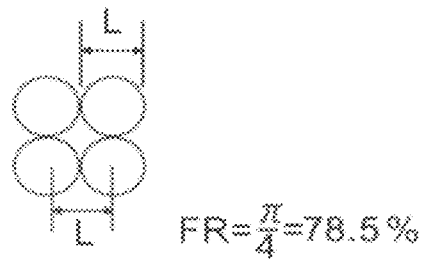
FIG. 7A to FIG. 7F are schematic plan views showing disposals of fine particles in the organic electroluminescent light emitting device according to the embodiment.
Figure 7B:
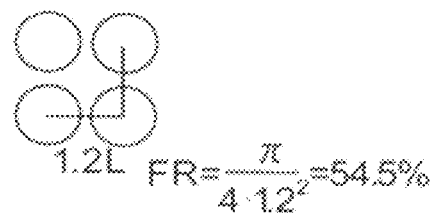
Figure 7C:
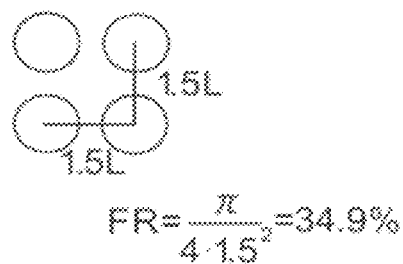
Figure 7D:
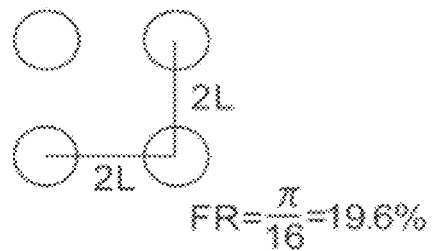
Figure 7E:
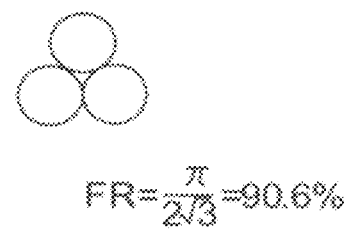
Figure 7F:
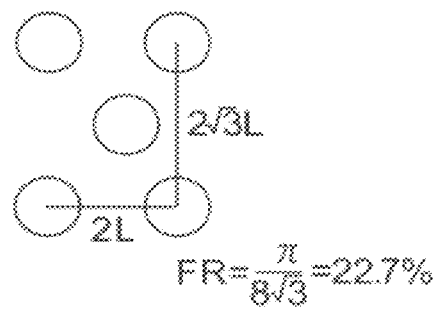

FIG. 7A to FIG. 7D correspond to cases in which the plurality of fine particles 21 is in a lattice arrangement, and FIG. 7E and FIG. 7F correspond to cases in which the plurality of fine particles 21 is in a hexagonal close-packed arrangement. In these drawings, examples are illustrated in which the gaps between the plurality of fine particles 21 are different from each other. In these drawings, it is assumed that the fine particles 21 are spheres with diameter L.

Here, the filling ratio FR of the fine particles 21 is defined. The filling ratio FR is the ratio of the area of the plurality of fine particles 21 to unit area of the major surface 10a of the transparent substrate 10 when viewed along the Z-axis. Here, the area of the plurality of fine particles 21 is the area of the plurality of fine particles 21 when projected onto a plane normal to the Z-axis.

As shown in FIG. 7A, when the plurality of fine particles 21 is arranged in a lattice arrangement with the fine particles 21 contacting each other, the distance between centers of the plurality of fine particles 21 is L. At this time the filling ratio FR is 78.5%.

As shown in FIG. 7B, FIG. 7C, and FIG. 7D, the filling ratio FR when the plurality of fine particles 21 is in a lattice arrangement and the distance between the centers of the plurality of fine particles 21 is 1.2L, 1.5L, and 2L is 54.5%, 34.9%, and 19.6% respectively.

As shown in FIG. 7E, when the plurality of fine particles 21 is in a hexagonal close-packed arrangement, and the plurality of fine particles 21 contact each other, the filling ratio FR is 90.6%.

As shown in FIG. 7F, when the plurality of fine particles 21 is in a hexagonal close-packed arrangement, and the distance between the second closest fine particles 21 is 2L, the filling ratio FR is 22.7%.

Assuming these arrangements, the refractive index of the fine particles 21 and the refractive index of the flattened layer 22 were varied, and the light extraction efficiency was obtained by ray tracing simulation. At this time each of the plurality of fine particles 21 is assumed to contact the major surface 10a of the transparent substrate 10.

Figure 8A:
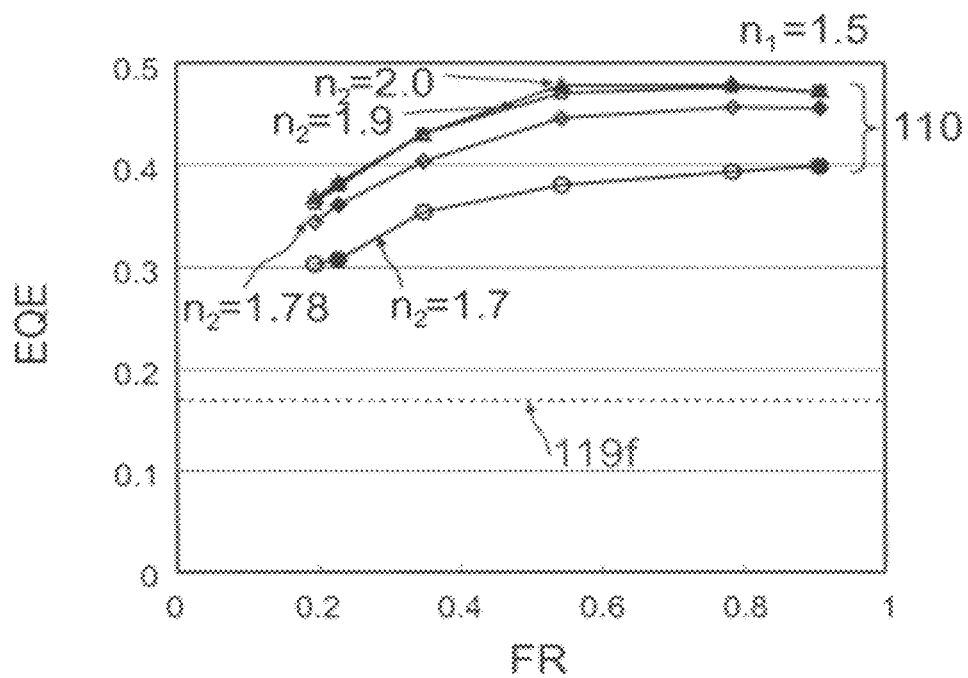
FIG. 8A and FIG. 8B are graphs showing the characteristics of the organic electroluminescent light emitting devices according to the embodiment.
Figure 8B:
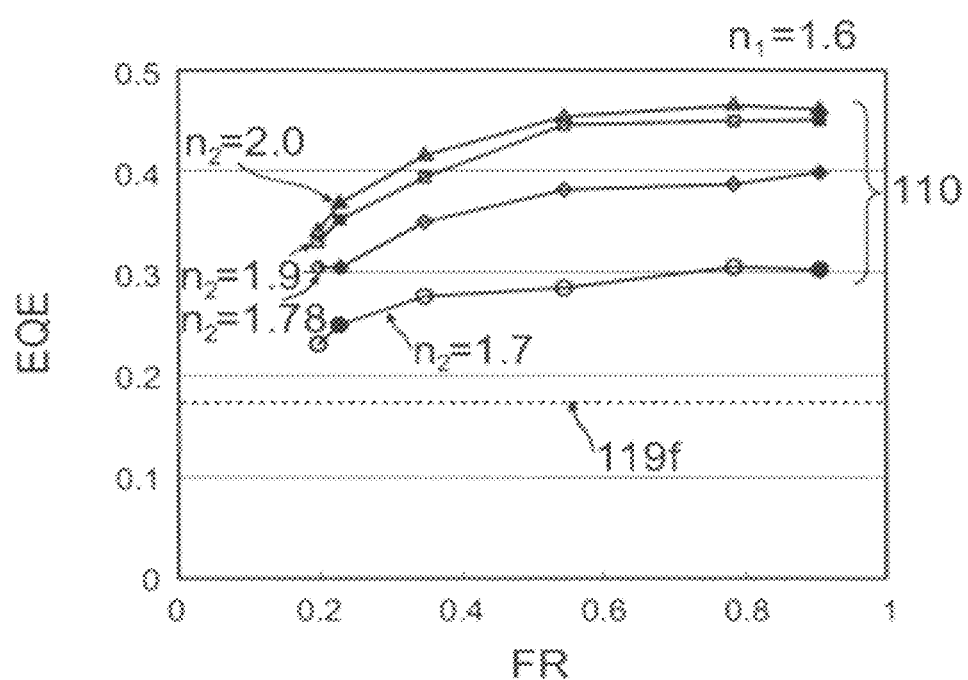

FIG. 8A and FIG. 8B are graphs illustrating the characteristics of the organic electroluminescent light emitting device according to the embodiment.

FIG. 8A corresponds to the case where the refractive index $n_1$ of the plurality of fine particles 21 is 1.5. This value corresponds to the case where the fine particles 21 are silica. FIG. 8B corresponds to the case where the refractive index $n_1$ of the plurality of fine particles 21 is 1.6. This value corresponds to the case where the fine particles 21 are polystyrene. In these graphs, the horizontal axis is the filling ratio FR. The vertical axis is the external quantum efficiency EQE. In these graphs, the light extraction efficiency EQE is shown when the refractive index $n_2$ of the flattened layer 22 is varied within the range 1.7 through 2.0. At this time the external quantum efficiency EQE is the value when the internal quantum efficiency of the device is 1.

Also, in these drawings, the characteristics of an organic electroluminescent light emitting device 119f according to a fifth reference example are shown. In the fifth reference example, the flattened layer 22 is provided but the fine particles 21 are not provided. This simulation focused on the external quantum efficiency in a configuration that included the fine particles 21, the flattened layer 22, and the transparent substrate 10, and the internal quantum efficiency was assumed to be 1, so the values of external quantum efficiency differ from the measured values shown in FIG. 6.

As shown in FIG. 8A and FIG. 8B, in the organic electroluminescent light emitting device 119f according to the fifth reference example which did not use the fine particles 21, the external quantum efficiency EQE was low at about 0.17.

In contrast, in the organic electroluminescent light emitting device 110 according to the embodiment which used the fine particles 21, the external quantum efficiency EQE was high at not less than 0.2. Also, the higher the filling ratio FR the higher the external quantum efficiency EQE. In practice, when the filling ratio FR is not less than 0.2, the external quantum efficiency EQE can be obtained sufficiently high compared with the reference example. In other words, in the embodiment, preferably the filling ratio FR is not less than 20%.

Also, if the filling ratio FR is not less than about 0.6, the external quantum efficiency EQE is almost constant. In other words, in the embodiment, more preferably the filling ratio FR is not less than 60%. For practical purposes the filling ratio FR is set to be not less than 40% and not more than 70%.

For example, when the manufacturing method explained in FIG. 4A and FIG. 4B are used, the fine particles 21 are adhered to the transparent substrate 10 in a self-organizing manner. When this method is used, a state in which most of the fine particles 21 contact other fine particles 21 while contacting the transparent substrate 10 is formed, but this could be difficult when taking productivity during mass production into account. In this case, preferably the filling ratio FR is controlled so that it is not less than, for example, 0.2. Further, preferably the filling ratio FR is controlled so that it is not less than, for example, 0.6. Thereby, a substantially sufficiently high external quantum efficiency EQE is obtained.

In the specific examples illustrated in FIG. 5A and FIG. 5B, the filling ratio FR is 35.3%.

Figure 9:
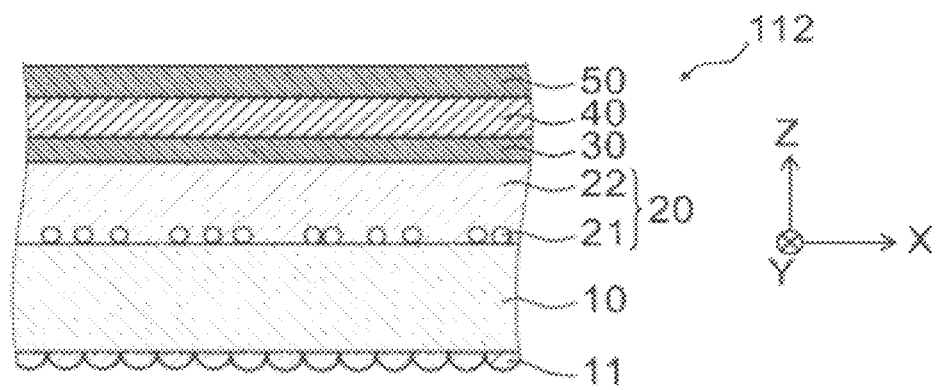
FIG. 9 is a schematic cross-sectional view showing another organic electroluminescent light emitting device according to the embodiment.

FIG. 9 is a schematic cross-sectional view illustrating the configuration of another organic electroluminescent light emitting device according to the embodiment. As shown in FIG. 9, in another organic electroluminescent light emitting device 112 according to the embodiment, a microlens layer 11 is provided on the surface of the transparent substrate 10 on the opposite side to the intermediate layer 20.

As an example of an organic electroluminescent light emitting device having this configuration, the microlens layer 11 was applied to the organic electroluminescent light emitting device 110s described in connection with FIG. 6, and an organic electroluminescent light emitting device 112s was fabricated. Likewise, the microlens layer 11 was applied to the organic electroluminescent light emitting device 119a according to the first reference example, and an organic electroluminescent light emitting device 119g (sixth reference example) was fabricated.

Figure 10:
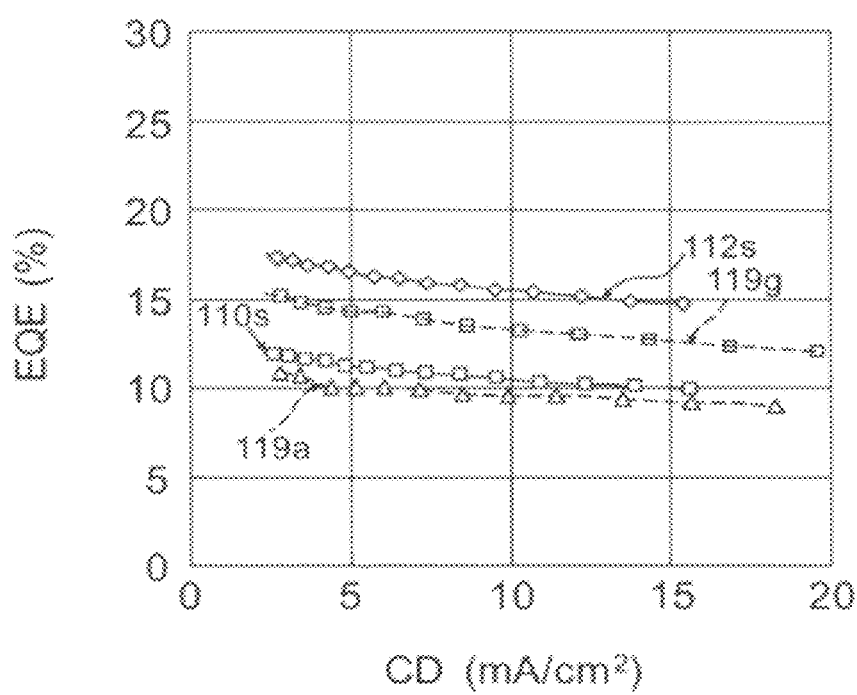
FIG. 10 is a graph showing the characteristics of the organic electroluminescent light emitting devices.

FIG. 10 is a graph illustrating the characteristics of the organic electroluminescent light emitting devices.

As shown in FIG. 10, the external quantum efficiency EQE of the organic electroluminescent light emitting device 112s that has been provided with the microlens layer 11 is higher than the organic electroluminescent light emitting device 119g according to the sixth reference example which has been provided with the microlens layer 11. Also, a higher external quantum efficiency EQE can be obtained for the organic electroluminescent light emitting device 112s compared with the organic electroluminescent light emitting device 110s.

The organic electroluminescent light emitting device according to the embodiment can be applied to plane light sources (a type of lighting device) that are used in, for example, lighting devices, displays, and so on.

Figure 11:
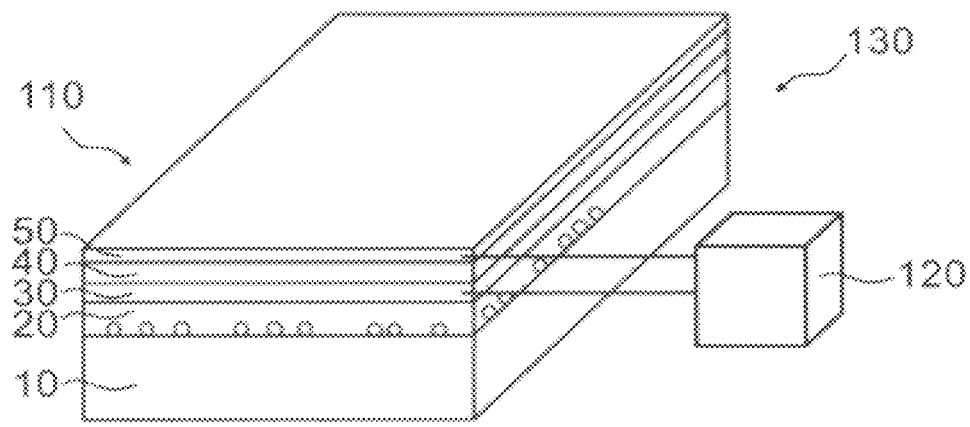
FIG. 11 is a schematic perspective view showing a lighting device according to the embodiment.

FIG. 11 is a schematic perspective view illustrating a configuration of a lighting device according to the embodiment.

As shown in FIG. 11, a lighting device 130 according to the embodiment includes an organic electroluminescent light emitting device and an electrical power source 120. Any desired organic electroluminescent light emitting device according to the embodiment can be used as the organic electroluminescent light emitting device. In this drawing, a case is illustrated in which the organic electroluminescent light emitting device 110 is used.

As described previously, the organic electroluminescent light emitting device 110 includes the transparent substrate 10, the intermediate layer 20, the first electrode 30, the organic light emitting layer 40, and the second electrode 50. The electrical power source 120 is connected to the first electrode 30 and the second electrode 50. The electrical power source 120 supplies current that flows through the organic light emitting layer 40.

The lighting device 130 uses the organic electroluminescent light emitting device according to the embodiment, thereby the light extraction efficiency is high. This allows a lighting device with a high energy efficiency to be provided.

Figure 12:
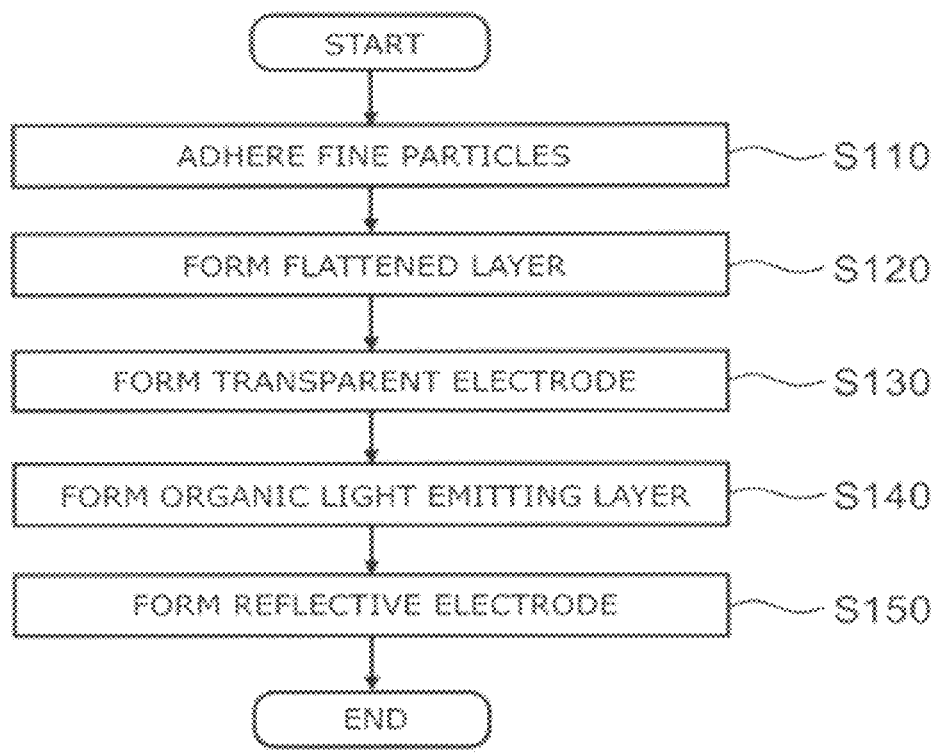
FIG. 12 is a flowchart showing a method for manufacturing the organic electroluminescent light emitting device according to the embodiment.

FIG. 12 is a flowchart illustrating a method for manufacturing the organic electroluminescent light emitting device according to the embodiment.

As shown in FIG. 12, in this manufacturing method, the plurality of fine particles 21, which is charged with a polarity that is different from the polarity of the charge of the transparent substrate 10, is adhered to the major surface 10a of the transparent substrate 10 (Step S110). For example, as described in connection with FIG. 4A, fine particles whose surfaces are modified with quaternary ammonium cation are used as the plurality of fine particles 21. By charging the plurality of fine particles 21 with a polarity that is different from the polarity of the charge of the transparent substrate 10, the fine particles 21 are adhered to the major surface 10a of the transparent substrate 10, and the plurality of fine particles 21 tends to separate from each other. Thereby, the plurality of fine particles 21 in an approximately single layer is adhered to the major surface 10a of the transparent substrate 10. In other words, self-organization of the fine particles 21 is used.

Then, the flattened layer 22 having a refractive index that is higher than the refractive index of the plurality of fine particles 21 is formed so that the surface that covers the plurality of fine particles 21 is flat (Step S120). The flattened layer 22 is transparent.

Then, the first electrode 30 is formed on the flattened layer 22 (Step S130). Then, the organic light emitting layer 40 is formed on the first electrode 30 (Step S140). Then, the second electrode 50 is formed on the organic light emitting layer 40 (Step S150).

This allows the plurality of fine particles to conveniently adhere to the transparent substrate 10 with a large area. Thereby, it is possible to manufacture with high productivity and low cost an organic electroluminescent light emitting device with high light extraction efficiency, in particular with a large area.

The method for manufacturing the organic electroluminescent light emitting device according to the embodiment is not limited to this manufacturing method. For example, the intermediate layer 20 may be formed by applying a resin liquid in which the plurality of fine particles 21 is dispersed in the resin that will form the flattened layer 22 onto the major surface 10a of the transparent substrate 10. For example, the intermediate layer 20 can be formed by spin-coating a solution in which silica fine particles are mixed in polysiloxane resin on the transparent substrate 10. At this time also, an approximately single layer of the fine particles 21 is adhered to the major surface 10a of the transparent substrate 10.

According to the embodiment, an organic electroluminescent light emitting device with high light extraction efficiency and method for manufacturing the same are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Embodiments of the invention with reference to examples were described above. However, the embodiments of the invention are not limited to these examples. The scope of the invention includes all cases in which a person skilled in the art could make use of publicly known information to appropriately select configuration elements such as the transparent substrate, the intermediate layer, the first electrode, the organic light emitting layer, and the second electrode, and the like included in the organic electroluminescent light emitting device, as well as the electrical power source included in the lighting device, provided that the obtained effects are similar.

Further, any two or more components of the specific examples may be combined within the extent of technical feasibility and are included in the scope of the invention to the extent that the purport of the invention is included.

Beside such cases, all organic electroluminescent light emitting devices and manufacturing methods for the same based on the embodiments of the organic electroluminescent light emitting device according to the invention and manufacturing methods for the same as described above that are obtainable through appropriate design modifications by a person skilled in the art shall be understood to fall within the scope of the invention, provided they do not depart from the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent light emitting device, comprising:
   a transparent substrate;
   an intermediate layer including a scattering layer and a flattened resin layer, the scattering layer being provided between the flattened resin layer and the transparent substrate, the scattering layer including a plurality of particles, the particles being adhered to a major surface of the transparent substrate, the flattened resin layer not including the particles, the flattened resin layer having a refractive index different from a refractive index of the particles, the flattened resin layer being transparent;
   a first electrode provided on the intermediate layer, the first electrode being transparent;
   an organic light emitting layer to emit a light including a component having a wavelength of a visible light, the organic light emitting layer being provided on the first electrode; and
   a second electrode provided on the organic light emitting layer,
   positions of the particles being random,
   the particles change a direction of the light emitted from the organic light emitting layer by at least one of scattering and refracting,
   an average diameter of the particles is not less than 200 nanometers and not more than 1.5 micrometers,
   a thickness of the flattened resin layer being greater than a thickness of the scattering layer and greater than the average diameter, and being not less than 200 nanometers,
   a thickness of the intermediate layer being not more than 6 micrometers.

2. The device according to claim 1, wherein an average diameter of the particles is not less than 600 nanometers and not more than 900 nanometers.

3. The device according to claim 1, wherein a ratio of an area of the particles when projected onto a plane normal to a first direction from the transparent substrate toward the second electrode, to a unit area of the surface when viewed along the first direction is not less than 20%.

4. The device according to claim 1, wherein a ratio of an area of the particles when projected onto a plane normal to a first direction from the transparent substrate toward the second electrode, to a unit area of the surface when viewed along the first direction is not less than 40% and not more than 70%.

5. The device according to claim 1, wherein the second electrode is reflective.

6. The device according to claim 1, wherein a thickness of a portion of the intermediate layer including the particles is not more than 4 times an average diameter of the particles.

7. The device according to claim 1, wherein a light emitted from the organic light emitting layer is white light.

8. The device according to claim 1, wherein the particles are made of an organic material.

9. The device according to claim 1, wherein the particles are made of an inorganic material.

10. The device according to claim 1, wherein the particles include at least one of silica and titanium oxide.

11. The device according to claim 1, wherein surfaces of the particles are modified with quaternary ammonium cation.

12. The device according to claim 1, wherein the flattened resin layer includes a polysiloxane resin.

13. The device according to claim 1, wherein a difference between a refractive index of the flattened resin layer and a refractive index of the first electrode, and a difference between the refractive index of the flattened resin layer and a refractive index of the organic light emitting layer are smaller than a difference between a refractive index of the particles and a refractive index of the first electrode and a difference between the refractive index of the particles and the refractive index of the organic light emitting layer.

* * * * *